United States Patent [19]
Sampey

[11] Patent Number: 5,877,705
[45] Date of Patent: Mar. 2, 1999

[54] METHOD AND APPARATUS FOR ANALYZING TRAFFIC AND A SENSOR THEREFOR

[75] Inventor: Harry R. Sampey, Farmington, Pa.

[73] Assignee: Nu-Metrics, Inc., Uniontown, Pa.

[21] Appl. No.: 845,003

[22] Filed: Apr. 22, 1997

[51] Int. Cl.$^6$ ........................................... G08G 1/01
[52] U.S. Cl. .................... 340/933; 340/941; 324/253
[58] Field of Search .................... 340/933, 936, 340/934, 941, 942; 324/253, 252, 207.21, 177, 178, 179

[56] References Cited

U.S. PATENT DOCUMENTS

| | | | |
|---|---|---|---|
| 4,232,285 | 11/1980 | Narbaits-Jaureguy et al. | 340/941 |
| 4,274,083 | 6/1981 | Tomoeda | 340/941 |
| 4,472,706 | 9/1984 | Hodge et al. | 340/941 |
| 4,509,131 | 4/1985 | Krasnjanski | 364/565 |
| 4,857,837 | 8/1989 | Baran et al. | 324/117 R |
| 5,408,179 | 4/1995 | Sampey et al. | 324/253 |
| 5,426,363 | 6/1995 | Akagi et al. | 324/239 |
| 5,455,768 | 10/1995 | Johnson et al. | 364/424.01 |
| 5,491,475 | 2/1996 | Rouse et al. | 340/933 |
| 5,523,753 | 6/1996 | Fedde et al. | 340/933 |

OTHER PUBLICATIONS

Smith et al., "Giant Magnetoresistance Materials and Integrated Magnetic Sensors", 1997, 8 pages.
Nonvolatile Electronics, Inc., "Engineering and Application Notes", Oct. 10, 1996, Cover Page plus pp. 1–31.

*Primary Examiner*—Jeffery A. Hofsass
*Assistant Examiner*—Toan N. Pham
*Attorney, Agent, or Firm*—Webb Ziesenheim Bruening Logsdon Orkin & Hanson, P.C.

[57] ABSTRACT

A detector for detecting a characteristic and a speed of a vehicle includes a first magnetic field sensor. The first magnetic field sensor includes a magnetically variable resistor that changes resistance in response to being exposed to a magnetic field. A bias is applied to the magnetically variable resistor and a change in the resistance thereof in response to an applied magnetic field is detected by an amplifier. The amplifier generates a first analog signal indicative of changes in the resistance of the magnetically variable resistor. A differentiating circuit differentiates the first analog signal and produces a first output that changes binary state in response to detecting a predetermined change in the differentiated first analog signal. A counter accumulates values at a predetermined rate and a microprocessor stores values of the counter corresponding to each change in the binary state of the first output of the differentiating circuit. The microprocessor converts the stored counter values into a first time series profile corresponding to changes in the first output of the differentiating circuit and accumulates and stores a count of a characteristic of the passing vehicle based on the first time series profile. A second time series profile is produced from counter values accumulated in response to the differentiating circuit producing a second output.

20 Claims, 7 Drawing Sheets

METHOD AND APPARATUS FOR ANALYZING TRAFFIC AND A SENSOR THEREFOR

BACKGROUND OF THE INVENTION

1. Field of the Invention

This invention relates to an apparatus and method for detecting vehicles or other magnetically permeable masses and measuring according to number, classification and speed and/or length.

2. Prior Art

Prior art traffic counters utilize road tube detection and magnetic loop sensing to detect the presence and/or movement of vehicles. The road tube counter comprises a flexible length of pressure tubing laid across the roadway. At one end of the tube, a pressure sensor is positioned to detect changes in the air pressure as wheels compress the tube. Disadvantages of road tubes are their susceptibility to damage and wear and their inability to count low speed vehicles. Magnetic loop sensors comprise a loop or coil of wire buried in a shallow trough in the roadway. The inductance of the coil due to the disturbance of the earth's magnetic field changes when a vehicle passes by. The change in inductance can be measured electronically. Disadvantages of the magnetic loop detector include installation requires tearing up the road, the detectors are susceptible to damage upon thermal expansion of the highway and they are unable to discriminate between closely passing vehicles.

Still another type of magnetic permeable sensor is described in U.S. Pat. No. 5,408,179 to Sampey et al. In this sensor, a ferromagnetic strip has a conductive winding wrapped about it. A small permanent magnet is positioned adjacent one end of the ferromagnetic strip. The magnet biases the ferromagnetic strip in a linear portion of its BH curve where the slope is substantially linear. An electronic circuit generates an analog signal indicative of the inductance of the winding as the earth's magnetic field is disturbed. Another electronic circuit digitizes the analog signal at spaced time intervals to produce a series of digitized values. A microprocessor processes the digitized values to produce a first time series profile that characterizes the presence and/or motion of the magnetic permeable mass. Another sensor, similar to the above-described sensor, is spaced apart from the above-described sensor a fixed distance in the direction of the travel of the magnetically permeable mass. The output of the second sensor is also digitized by the electronic circuit to produce another series of digitized values. The microprocessor processes these digitized values to produce a second time series profile and determines equivalent positions in the first time series profile and second time series profile.

A disadvantage of this sensor is that a 100 Khz excitation signal utilized to stimulate the conductive winding also produces undesirable noise in other components of the electronic circuitry.

It is, therefore, an object of the present invention to provide a new apparatus and method for detecting characteristics of a magnetically permeable mass and detecting a speed of a magnetically permeable mass that avoids the above disadvantages and others. Still other objects of the invention will become apparent to one of ordinary skill in the art upon reading and understanding the ensuing detailed description.

SUMMARY OF THE INVENTION

Accordingly, I have invented a sensor for detecting a magnetically permeable mass by disturbance of the earth's magnetic field adjacent the sensor. The sensor includes a magnetic field detector formed from one or more magnetically variable resistors. A flux concentrator is positioned for concentrating magnetic flux towards the one or more magnetically variable resistors. A biasing means supplies an electrical bias to the one or more magnetically variable resistors. An amplifier senses changes in the resistance of the one or more magnetically variable resistors and produces an output indicative thereof. A differentiator differentiates the output of the amplifier and a zero slope detector detects the output of the differentiator and generates a binary changing signal when the output of the differentiator is zero. A counter accumulates values at a predetermined rate and a processor stores a value of the counter when the zero slope detector generates the binary changing signal.

The one or more magnetically variable resistors and the flux concentrator are enclosed in a package. An external flux concentrator is positioned on one end of the package. The external flux concentrator includes a neck that extends towards a central part of the package and the neck of the external flux concentrator terminates at a distal end adjacent the one or more magnetically variable resistors. The external flux concentrator has a permeability of about 35,000 at 40 gauss.

In another embodiment, an apparatus for detecting the speed of a magnetically permeable mass by disturbance of the earth's magnetic field adjacent the apparatus includes first and second magnetic field sensors. Each of the first and second magnetic field sensors includes a magnetic field detector formed from a magnetically variable resistor. A first flux concentrator is positioned for concentrating magnetic flux towards the magnetically variable resistor. A biasing means supplies an electrical bias to the magnetically variable resistor and an amplifier senses the changes in the resistance of the magnetically variable resistor and produces an output indicative thereof. A differentiator differentiates the output of the amplifier and a zero slope detector detects the output of the differentiator and generates a binary changing signal when the output of the differentiator is zero. The apparatus further includes a counter that accumulates values at a predetermined rate. A processor stores a first series of values of the counter in response to the zero slope detector of the first magnetic field sensor generating binary changing signals. The processor also stores a second series of values of the counter in response to the zero slope detector of the second magnetic field sensor generating binary changing signals. The processor converts the first series of values and the second series of values into a first and second time series profile, respectively. The processor measures a difference in time between equivalent positions in the first and second time series profiles and calculates the speed of the masses as a function of the difference.

The magnetically variable resistor is formed from a pair of magnetically variable resistors positioned end-to-end and forming a gap therebetween. The first flux concentrator is positioned on opposite sides of the pair of end-to-end magnetically variable resistors. An external flux concentrator is positionable adjacent the sides of the first flux concentrator opposite the pair of end-to-end magnetically variable resistors. The external flux concentrator adjacent one side of the flux concentrator has a neck that extends towards the pair of end-to-end magnetically variable resistors and terminates at a distal end adjacent thereof. The pair of end-to-end magnetically variable resistors are positionable substantially perpendicular to a direction of travel of the mass. The processor calculates from one of the first time series profile and the second time series profile a time the mass is over the respective first magnetic field sensor and second magnetic field sensor and the length of the mass passing thereby. A compensating means is provided for compensating a bias on the amplifier.

In a method for counting vehicles passing a location, the resistance of a first magnetically variable resistor is detected in response to a vehicle passing thereby. A first analog signal is generated corresponding to changes in the resistance of the first magnetically variable resistor and the first analog signal is differentiated. A first binary changing signal is produced that changes binary state when the slope of the differentiated first analog signal equals zero. A first series of times when the first binary changing signal changes binary state are recorded and a first time series profile is produced from the recorded first series of times. A count of passing vehicles is accumulated and stored as a function of the first time series profile.

To detect the speed of a vehicle, the resistance of a second magnetically variable resistor is detected in response to the vehicle passing thereby. The second magnetically variable resistor is spaced apart from the first magnetically variable resistor. A second analog signal is generated corresponding to the changes in the resistance of the second magnetically variable resistor. The second analog signal is differentiated and a second binary changing signal is produced that changes binary state when the slope of the differentiated second analog signal equals zero. A second series of times are recorded when the second binary changing signal changes binary state. A second time series profile is produced from the recorded second series of times and spaced equivalent positions in the first time series profile and the second time series profile are determined. An elapsed time between the spaced equivalent positions is measured and the speed of the vehicle is calculated from the elapsed time. A count of the speed of the passing vehicles is accumulated and stored.

In another embodiment, an apparatus for counting vehicles passing a location is provided. The apparatus includes a first magnetically variable resistor positionable to detect changes in a first magnetic field at the location in response to vehicles passing thereby. An amplifier is connected to the first magnetically variable resistor for generating a first analog signal corresponding to changes in the resistance of the first magnetically variable resistor. A converting means converts the first analog signal into a first time series profile and a storage means accumulates and stores a count of passing vehicles. A second magnetically variable resistor is positionable to detect changes in the magnetic field at the location in response to vehicles passing thereby. The second magnetically variable resistor is spaced apart from the first magnetically variable resistor preferably in a direction of travel of the vehicle. The amplifier means is connected to the second magnetically variable resistor for generating a second analog signal corresponding to changes in the resistance of the second magnetically variable resistor. The converting means converts the second analog signal into a second time series profile. A measuring means measures elapsed time between spaced equivalent positions in the first and second time series profiles and calculates the speed of the vehicle therefrom whereby the count is classified according to speed.

DETAILED DESCRIPTION OF THE PREFERRED EMBODIMENTS

Figure 1:
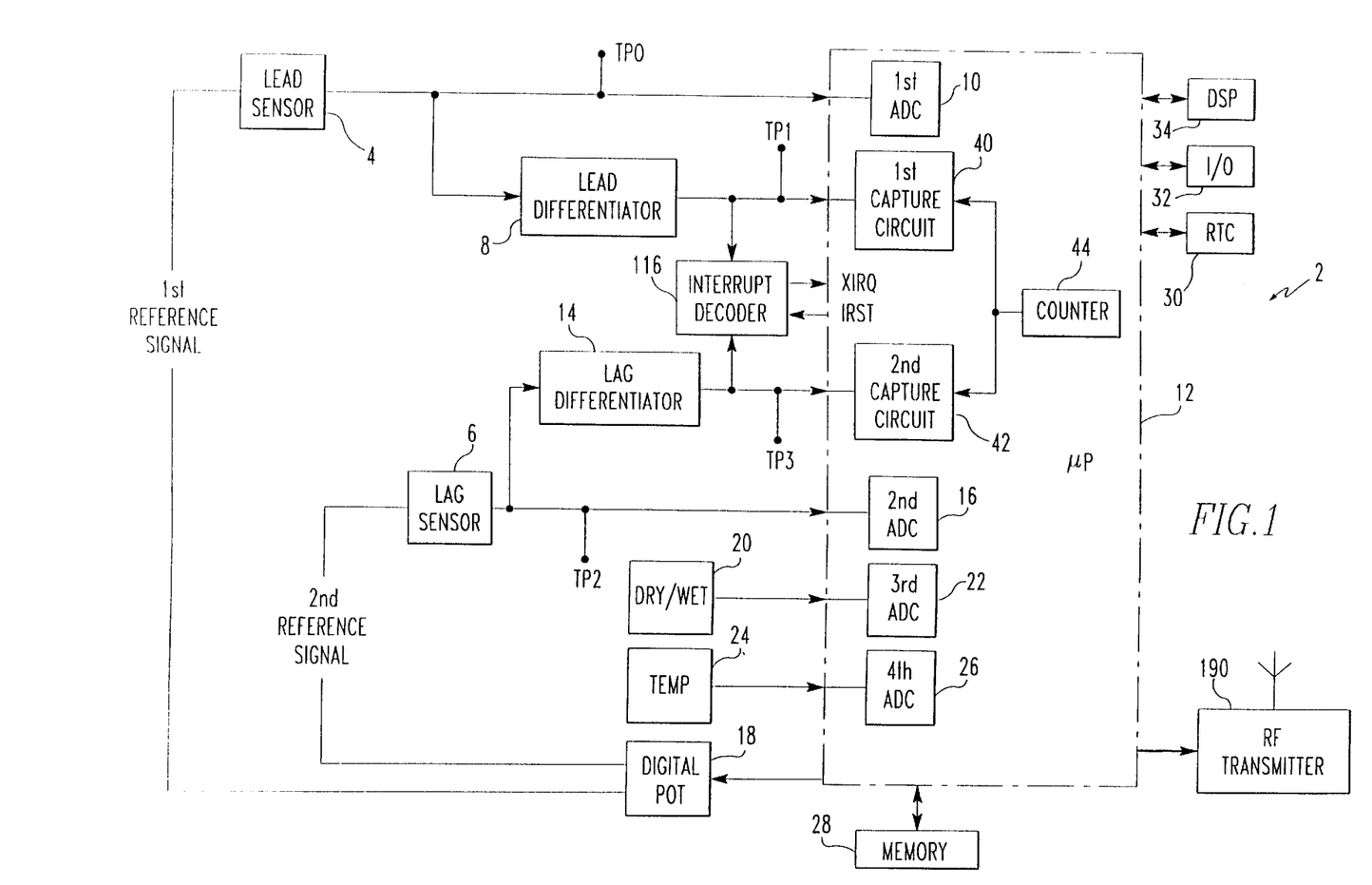
FIG. 1 is a block diagram illustrating the organization of circuitry for the vehicle magnetic imaging (VMI) sensor of the present invention.

With reference to FIG. 1, a vehicle magnetic imaging (VMI) sensor 2 is comprised of a first or lead magnetic field sensor 4 and a second or lag magnetic field sensor 6. The lead sensor 4 has an output connected to a lead differentiator 8 and a first analog-to-digital converter (ADC) 10 of a microprocessor 12. The lag sensor 6 has an output connected to a lag differentiator 14 and a second ADC 16 of the microprocessor 12. A compensator or digital potentiometer 18 is selectively connected between an output of the microprocessor 12 and inputs of the lead sensor 4 and the lag sensor 6. The digital potentiometer 18 selectively supplies reference signals, to be described in greater detail hereinafter, to the lead sensor 4 or the lag sensor 6 in response to the generation of control signals by the microprocessor 12. A dry/wet sensor 20 is connected to a third ADC 22 of the microprocessor 12. The dry/wet sensor 20 provides to the microprocessor 12 an indication of the presence or absence of moisture on a roadway. A temperature sensor 24 is connected to a fourth ADC 26 of the microprocessor 12 and provides to the microprocessor 12 an indication of the temperature of the roadway. The microprocessor 12 also includes other internal circuitry that is not shown in FIG. 1 for simplicity. The microprocessor 12 preferably has connected thereto associated battery backed-up RAM memory 28, a real time clock (RTC) 30, input/output (I/O) circuitry 32 for programming and uploading of data stored in memory 28, and, optionally, a digital signal processor (DSP) 34. The electrical and electronic elements described so far are enclosed in a sealed enclosure (not shown) and are powered by rechargeable batteries stored in the enclosure.

In a preferred embodiment, the lead sensor 4 and the lag sensor 6 are spaced apart a selected distance, preferably about 4–6 inches, in a direction of travel of traffic. The lead sensor 4 generates a first or lead analog signal indicative of the change in the magnetic field strength adjacent the lead sensor 4 in response to the passage of a vehicle, such as a car, a truck, a bus, or other magnetically permeable masses, thereby. Similarly, the lag sensor 6 generates a second or lag analog signal indicative of the change in magnetic field strength adjacent the lag sensor 6 in response to the passage of the vehicle thereby.

The lead differentiator 8 differentiates the first analog signal generated by the lead sensor 4 and produces an output that changes binary states in response to detecting a predetermined change in the differentiated first analog signal output of the lead sensor 4. More specifically, the output of the lead differentiator 8 changes binary state when the derivative of the analog signal output by the lead sensor 4 changes to zero. The binary changing output of the lead differentiator 8 is provided to a first capture circuit 40 internal to the microprocessor 12. Similarly, the lag differentiator 14 differentiates the second analog signal generated by the lag sensor 6 and produces a binary changing output when the derivative of the analog signal output by the lag sensor 6 changes to zero. The binary changing output of the lag sensor 6 is provided to a second capture circuit 42 internal to the microprocessor 12.

The microprocessor 12 also includes a counter 44 that is connected to the first capture circuit 40 and the second capture circuit 42. The counter 44 is a register internal to the microprocessor 12 that accumulates values or counts at a predetermined rate or frequency $F_c$.

The changing logic levels of the lead differentiator 8 and the lag differentiator 14 are provided to the respective first capture circuit 40 and the second capture circuit 42. The first capture circuit 40 and second capture circuit 42 respond to the binary changing outputs of the respective lead differentiator 8 and lag differentiator 14 by reading the current value of the counter 44. Values of the counter read by the first capture circuit 40 and the second capture circuit 42 are stored in memory 28 for subsequent processing.

At an appropriate time, during or after the vehicle has passed, the microprocessor 12 retrieves from memory 28 the stored counter values obtained from the first capture circuit 40 and/or the second capture circuit 42 and converts the same into a first time series or lead profile and/or a second time series or lag profile, respectively. In one embodiment of the invention, the microprocessor 12 compares the lead profile or the lag profile to exemplary profiles stored in memory 28. Based on this comparison, the microprocessor 12 determines a characteristic of the vehicle, such as, without limitation, if the vehicle is a car or a truck. Once determined, the microprocessor 12 accumulates and stores in memory 28 a count of like vehicles passing the lead sensor or the lag sensor. Alternatively, the microprocessor 12 simply accumulates and stores a count of vehicles determined to have passed the VMI sensor 2 without performing the above comparison.

In another embodiment, the microprocessor 12 detects spaced equivalent positions in the lead profile and the lag profile. When the spaced equivalent positions in the lead profile and the lag profile are detected, the microprocessor 12 calculates a speed of the vehicle as a function of the elapsed time between these spaced equivalent positions. Once calculated, the speed of the vehicle is accumulated and stored in the memory 28.

In still yet another embodiment, the characteristic of the vehicle, e.g., vehicle type, and the speed of the vehicle can be determined in the above-described manners and separate counts of vehicle characteristics and vehicle speed are accumulated and stored in the memory 28.

From the foregoing, it should be appreciated that a VMI sensor 2 for detecting characteristics of vehicles passing thereby can be formed from one magnetic sensor. However, if it is desired to detect the speed of a vehicle passing the VMI sensor 2, two spaced apart magnetic sensors are required.

Figure 2:
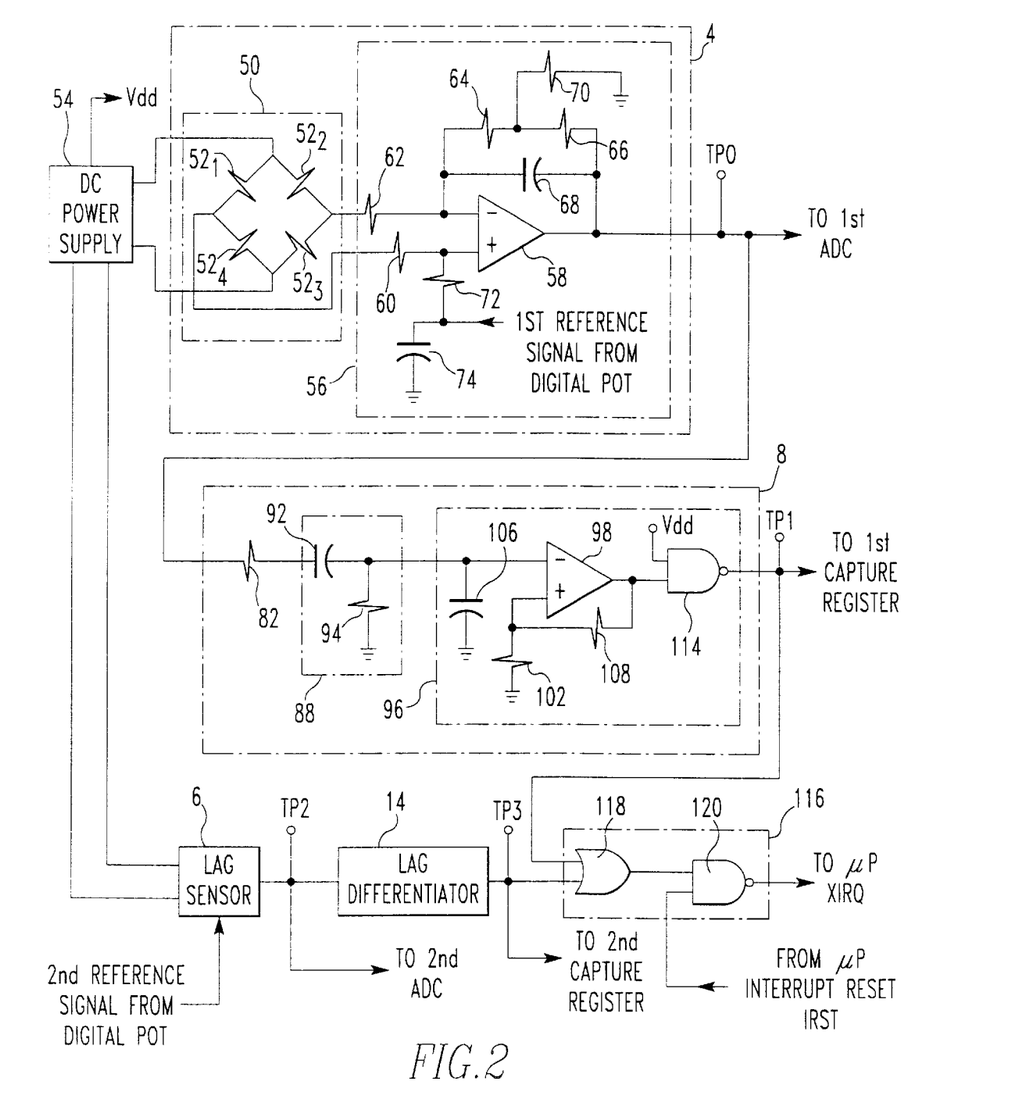
FIG. 2 is a generalized schematic diagram of the electronic circuit of the VMI sensor of FIG. 1.

With reference to FIG. 2 and with continuing reference to FIG. 1, the lead sensor 4 and the lag sensor 6 each include a magnetic detector 50. The magnetic detector 50 is comprised of one or more magnetically variable resistors 52. Preferably, the magnetically variable resistors $52_1$, $52_2$, $52_3$, $52_4$ are connected in a Wheatstone bridge configuration. Two opposing nodes of the Wheatstone bridge are connected to a DC power supply 54. The other two opposing nodes of the Wheatstone bridge are connected to an amplifier circuit 56. The amplifier circuit 56 includes difference amplifier 58; drop resistor 60 connected between one output of the Wheatstone bridge and the non-inverting input of the difference amplifier 58; and resistor 62 connected between the other output of the Wheatstone bridge and the inverting input of the difference amplifier 58. Connected between the output and the non-inverting input of the difference amplifier 58 is a feedback network comprised of series connected feedback resistors 64, 66 and parallel capacitor 68. Bias resistor 70 is connected between ground and the node between feedback resistors 64, 66. A reference signal from the digital potentiometer 18 is provided to the non-inverting input of the difference amplifier 58 via resistor 72. A filter capacitor 74 is connected between ground and the side of resistor 72 opposite the non-inverting input of difference amplifier 58 to filter AC noise superimposed on the reference signal from the digital potentiometer 18. The difference amplifier 58 amplifies the output of the magnetic detector 50. The amplified output of the difference amplifier 58 is provided to ADC 10 or 16 and to a differentiator 8 or 14. Each differentiator 8, 14 includes a drop resistor 82. A differentiator 88 which includes differentiating capacitor 92 and bleed resistor 94 is connected to the side of drop resistor 82 opposite the amplifier circuit 56. The output of the differentiator 88 is provided to a zero slope detector 96. The zero slope detector 96 includes comparator 98 having bias resistor 102 connected between the non-inverting input thereof and ground. A capacitor 106 is connected between the inverting input of comparator 98 and ground. A feedback resistor 108 is connected between the output of the comparator 98 and the non-inverting input thereof. The output of the comparator 98 is provided to one input of a Schmit trigger NAND gate 114 which has its other input biased by the Vdd output of the DC power supply 54.

The output of the zero slope detector 96 is provided to a capture register 40 or 42. The output of zero slope detector 96 changes state in response to detecting the output of the differentiating circuit 88 changing to zero. However, this output only changes state when the output of the differentiating circuit 88 initially changes to zero. Thus, if the output of the differentiating circuit 88 equals zero for an extended interval, such as in the presence of a stationary vehicle positioned adjacent the magnetic detector 50, the output of the zero slope detector 96 will not continuously change state.

The microprocessor 12 preferably enters into a low power or sleep mode in the absence of vehicles passing adjacent the sensors 4, 6 within a predetermined interval of time. In this manner, the battery contained in the sealed enclosure is preserved. When a vehicle passes by the lead sensor 4 and/or the lag sensor 6, the microprocessor 12 is awakened from its sleep mode by an interrupt request (XIRQ) received from the output of one or both of the differentiators. More specifically, in addition to being provided to the capture circuits 40, 42, the outputs of the differentiators 8, 14 are provided to an interrupt decoder 116. The interrupt decoder 116 includes OR gate 118 and NAND gate 120. The inputs of the OR gate 118 receive the outputs of differentiators 8, 14. The output of the OR gate 118 is provided to an input of the NAND gate 120. In response to receiving an interrupt request from the NAND gate 120, the microprocessor 12 awakens from its sleep mode and begins processing vehicle data related to the passing vehicle.

The other input of the NAND gate 120 is connected to an interrupt reset (IRST) output of the microprocessor 12. The interrupt reset output establishes an appropriate logic level at the input to the NAND gate 120 so that the microprocessor 12 does not receive interrupt requests when it is not in its sleep mode, e.g., when the microprocessor 12 is processing vehicle data related to the passing vehicle. Similarly, before entering sleep mode the microprossor 12 establishes the interrupt reset output so that a passing vehicle causes the NAND gate 120 to generate an interrupt request which awakens microprossor 12 from its sleep mode to begin processing vehicle information.

Figure 3:
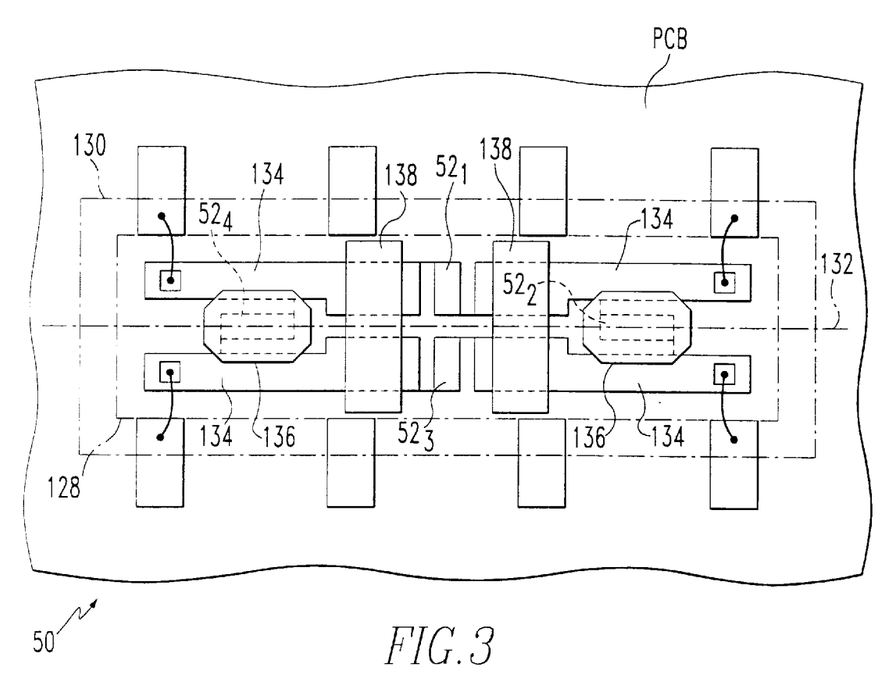
FIG. 3 is a plan view of a magnetic detector utilized in the VMI sensor of FIG. 1.

With reference to FIG. 3, in a preferred embodiment, the magnetic detector 50 is formed on a silicon substrate 128 which is positioned in a hermetically sealed integrated circuit package 130. Two of the magnetically variable resistors 52 connected in opposing legs of the Wheatstone bridge, i.e., $52_1$, $52_3$ in FIG. 3, are positioned end-to-end with a gap formed therebetween. The end-to-end resistors $52_1$, $52_3$ are oriented perpendicular to the longitudinal axis 132 of the integrated circuit package 130. The other magnetically variable resistors of the Wheatstone bridge, i.e., 522, 524, are oriented along the longitudinal axis 132 of the integrated circuit package 130.

The magnetically variable resistors are formed by depositing on the silicon substrate 128, a plurality of metallic thin films each having a thickness of preferably less than 10 nm, and more preferably less than 5 nm, separated by non-magnetic layers of substantially equal thickness. Each of the magnetically variable resistors $52_1$–$52_4$ is formed having the same resistance. The resistance of the Wheatstone bridge connected magnetically variable resistors $52_1$–$52_4$ is preferably between 5 kilohms and 30 kilohms in the absence of a magnetic field.

The magnetically variable resistors $54_1$–$54_4$ decrease in resistance when exposed to a magnetic field. This decrease in resistance is caused by the spin dependence of electron scattering and the spin polarization of conduction electrons in magnetic layers. With layers of proper thickness, adjacent magnetic layers couple anti-ferromagnetically to each other with the magnetic moments of each magnetic layer aligned anti-parallel to the adjacent magnetic layers. Conduction electrons, spin polarized in one magnetic layer, are scattered as they reach the interface to an adjacent magnetic layer with anti-parallel conduction electron spins. This scattering results in high resistivity. If, however, an external magnetic field is applied, conduction electrons in adjacent ferromagnetic layers become aligned. This alignment decreases the spin dependent scattering of conduction electrons thereby decreasing the resistance of the magnetically variable resistors.

The magnetically variable resistors deposited on the silicon substrate are electrically connected in the Wheatstone bridge configuration utilizing thin film metal interconnects 134. A layer of magnetic material 136 is deposited over one pair of magnetically variable resistors, e.g., $52_2$, $52_4$, in opposing legs of the Wheatstone bridge configuration. This layer of magnetic material 136 shields these resistors from magnetic fields. Hence, these shielded resistors $52_2$, $52_4$ are utilized in the Wheatstone bridge configuration as reference resistors. In contrast, it is desirable to expose the other two opposing resistors of the Wheatstone bridge, i.e., $52_1$, $52_3$, to magnetic fields. To enable magnetic flux to be focused towards the magnetically exposed resistors $52_1$, $52_3$, flux concentrators 138 are deposited on the silicon substrate on opposite sides of the end-to-end resistors $52_1$, $52_3$. The flux concentrators 138, like the shield 136, are formed from a layer of magnetic material deposited on the silicon substrate 128. The flux concentrators 138 increase the sensitivity of the magnetically variable resistors, preferably, by a concentration factor of between 2–100. The flux concentration factor is approximately equivalent to the length of one flux concentrator 138 divided by the length of the gap between the flux concentrators 138.

Figure 4:
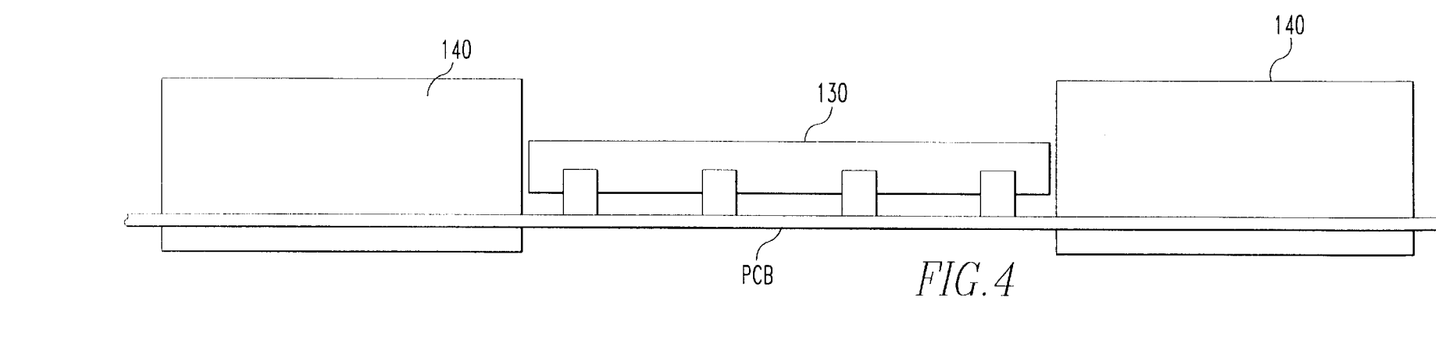
FIGS. 4 and 5 are side views of the magnetic detector of FIG. 3 including external flux concentrators at each end thereof.

With reference to FIG. 4 and with continuing reference to FIG. 3, the sensitivity of the magnetically exposed resistors $52_1$, $52_3$ may be further increased by positioning an external flux concentrator 140 on opposite ends of the integrated circuit package 130. Preferably, the length-wise axis of each external flux concentrator 140 is aligned with the longitudinal axis 132 of the integrated circuit package 130. Each external flux concentrator 140 is preferably formed from a shielding alloy manufactured by AD-VANCE Magnetics, Inc., of 625 Monroe Street, Rochester, Ind. 46975 and sold commercially under the trade name AD-MU-80. Typical DC magnetic properties for AD-MU-80 include an initial permeability of 35,000 at 40 gauss; a permeability of 45,000 between 100–200 gauss; a maximum permeability of 350,000; and a saturation inductance of 8,200 gauss.

Figure 5:
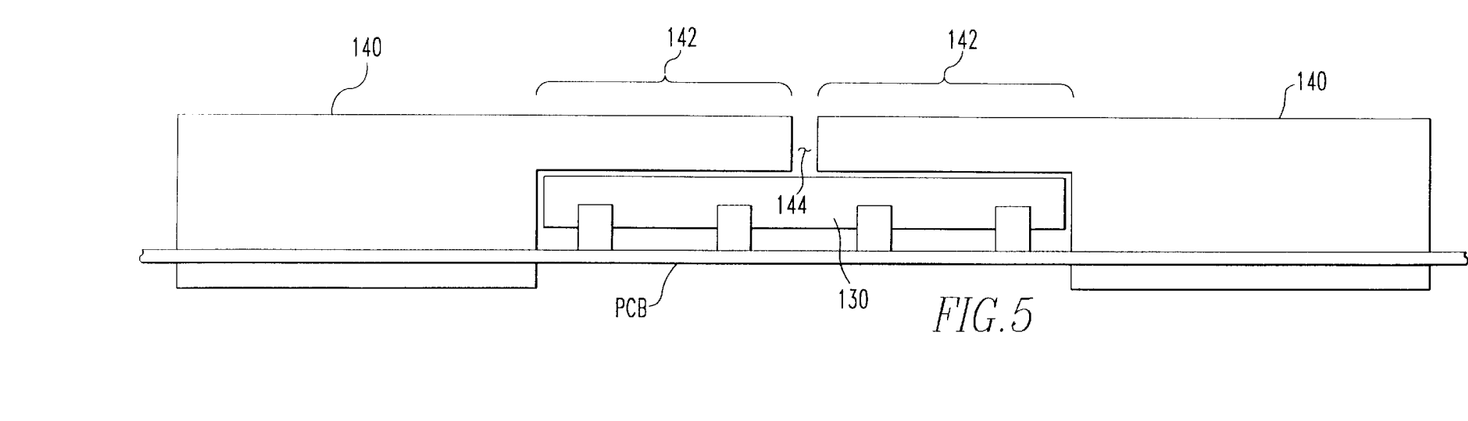

With reference to FIG. 5 and with continuing reference to FIGS. 3 and 4, the sensitivity of the magnetically exposed resistors $52_1$, $52_3$ may be further increased by positioning the external flux concentrator 140 closer to the magnetically exposed resistors $52_1$, $52_3$. To this end, each external flux concentrator 140 preferably has a neck 142 that extends from one end of the integrated circuit package 130 towards the other end thereof. The distal ends of the necks 142 terminate in spaced relation thereby forming a gap 144 therebetween. Preferably, the ends of the necks 142 terminate on opposite sides of the end-to-end positioned magnetically variable resistors 521, 523.

With reference back to FIGS. 1 and 2, the first ADC 10 and the second ADC 16 monitor the lead sensor 4 and the lag sensor 6, respectively, to determine if a shift in the outputs thereof has occurred in response to a quiescent condition, such as, for example, local magnetic conditions, a stationary magnetic permeable mass, and/or a moving magnetically permeable mass. If a shift in the electrical output is detected for a predetermined interval, the microprocessor 12 supplies a control signal to the digital potentiometer 18 to adjust the value of the first reference signal and/or the second reference signal. Changing the value of the first reference signal and/or the second reference signal changes the bias applied to the non-inverting input of the difference amplifier 58 of the lead sensor 4 and the lag sensor 6, respectively. Thus, the output of the lead sensor 4 and/or the lag sensor 6 can be adjusted to compensate for the quiescent condition.

Figure 6:
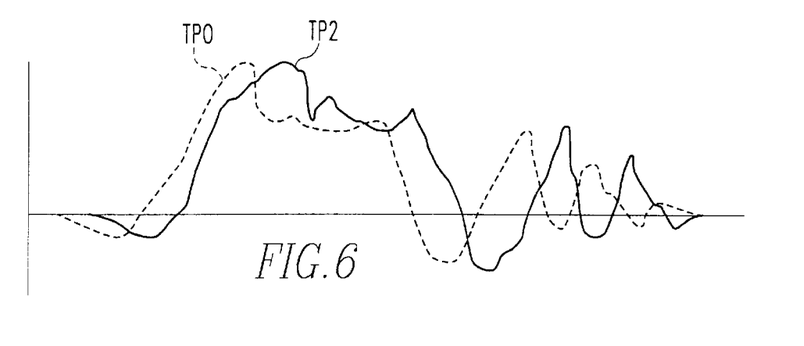
FIG. 6 illustrates an exemplary intensity profile for the lead sensor and lag sensor of the VMI sensor of FIG. 1.
Figure 7:
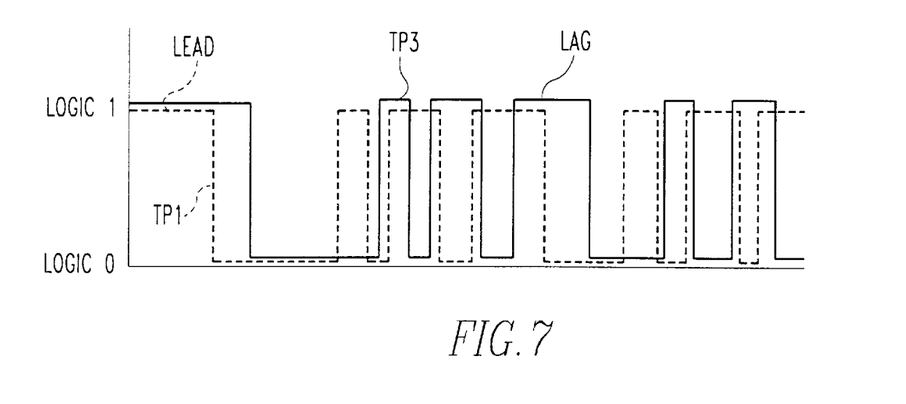
FIG. 7 illustrates exemplary outputs of the lead differentiator and the lag differentiator of the VMI sensor of FIG. 1 when stimulated by the intensity profiles of FIG. 6.

With reference to FIGS. 6 and 7 and with continuing reference to FIGS. 1 and 2, the output of the lead sensor 4 in response to a passing vehicle is present at test point zero (TP0) and the output of the lag sensor is present at test point two (TP2). As shown in FIG. 6, the signal at TP2 is shifted in time with respect to the signal at TP0. The signals at TP0 and TP2 are shown as being slightly different for illustration purposes. As shown in FIG. 7, each time the differentiated signal at TP0 changes to zero, the output of the lead differeniator 8, present at test point one (TP1), changes binary state. Similarly, each time the differentiated signal TP2 changes to zero, the output of the lag sensor 6, present at test point three (TP3), changes state. While illustrated in FIG. 7 as having a starting logic value of one, the starting value of the output of the differentiators 8, 14, present at TP1 and TP3, could also be logic zero. The signal levels at TP1 and TP3 in FIG. 5 are shown as being shifted in amplitude for illustration purposes.

The capture circuits 40, 42 sample the output of the differentiators 8, 14 approximately every 8 microseconds. When a change in output is detected by the first capture circuit 40 and/or the second capture circuit 42, the capture circuit detecting the change reads the current value of the counter 44 and stores the value into memory 28 for subsequent processing into a first time series or lead profile and/or a second time series or lag profile.

Figure 8:
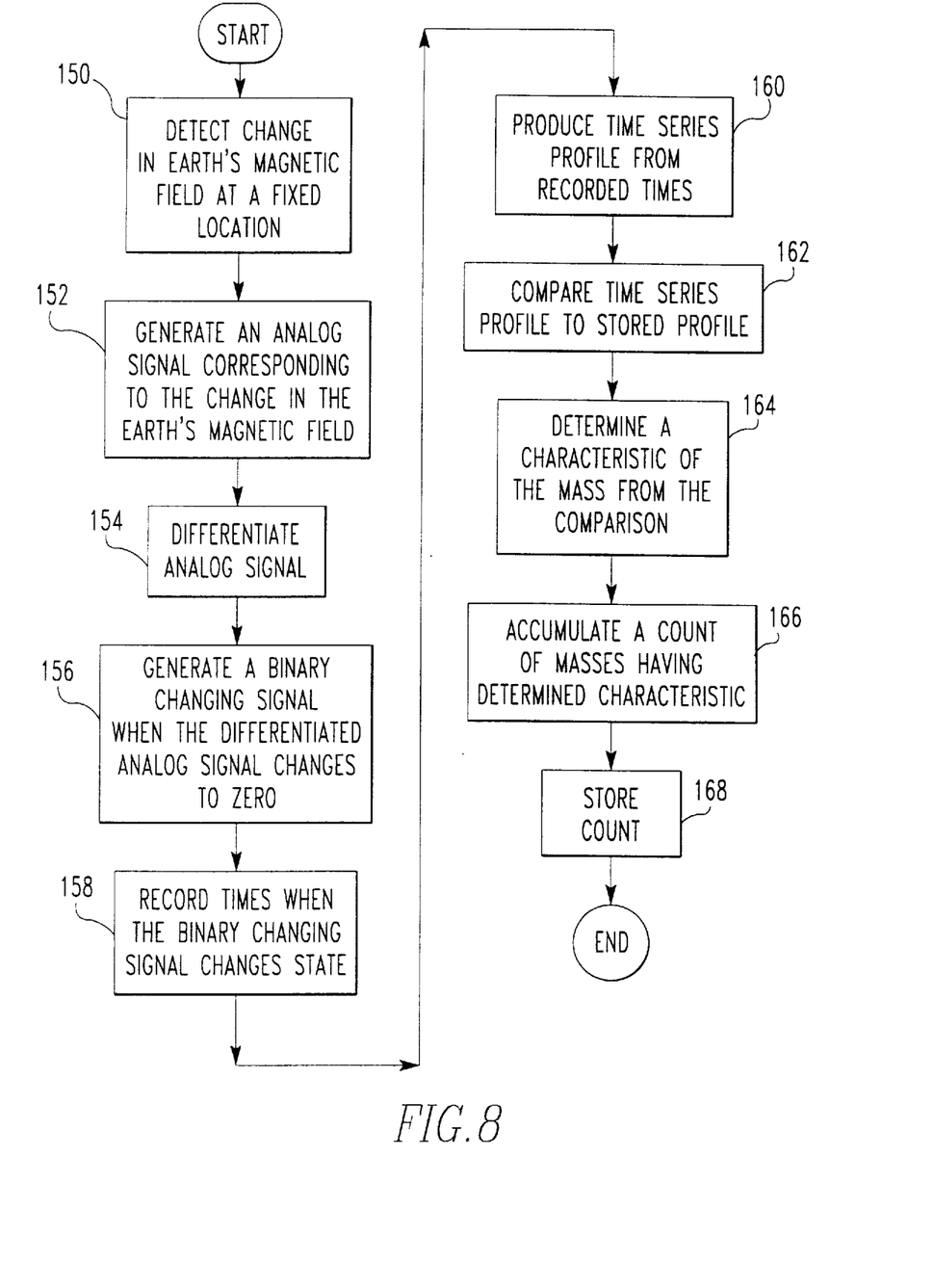
FIG. 8 is a diagrammatic illustration of the procedure for determining a characteristic of a magnetically permeable mass.

With reference to FIG. 8, a flow chart illustrating a method for determining a characteristic of a magnetically permeable mass is provided. At step 150, a change in the earth's magnetic field is detected at a fixed location. An analog signal corresponding to the change in the earth's magnetic field is generated at step 152. The analog signal is differentiated at step 154. At step 156 a binary changing signal is generated when the differentiated analog signal changes to zero. The times when the binary changing signal changes state are recorded at step 158. At step 160, a time series profile is produced from the recorded times. The time series profile is compared to a stored profile at step 162 and, at step 164, a characteristic of the mass is determined from the comparison. A count of masses having the determined characteristic is determined at step 166 and the count is stored at step 168.

Figure 9:
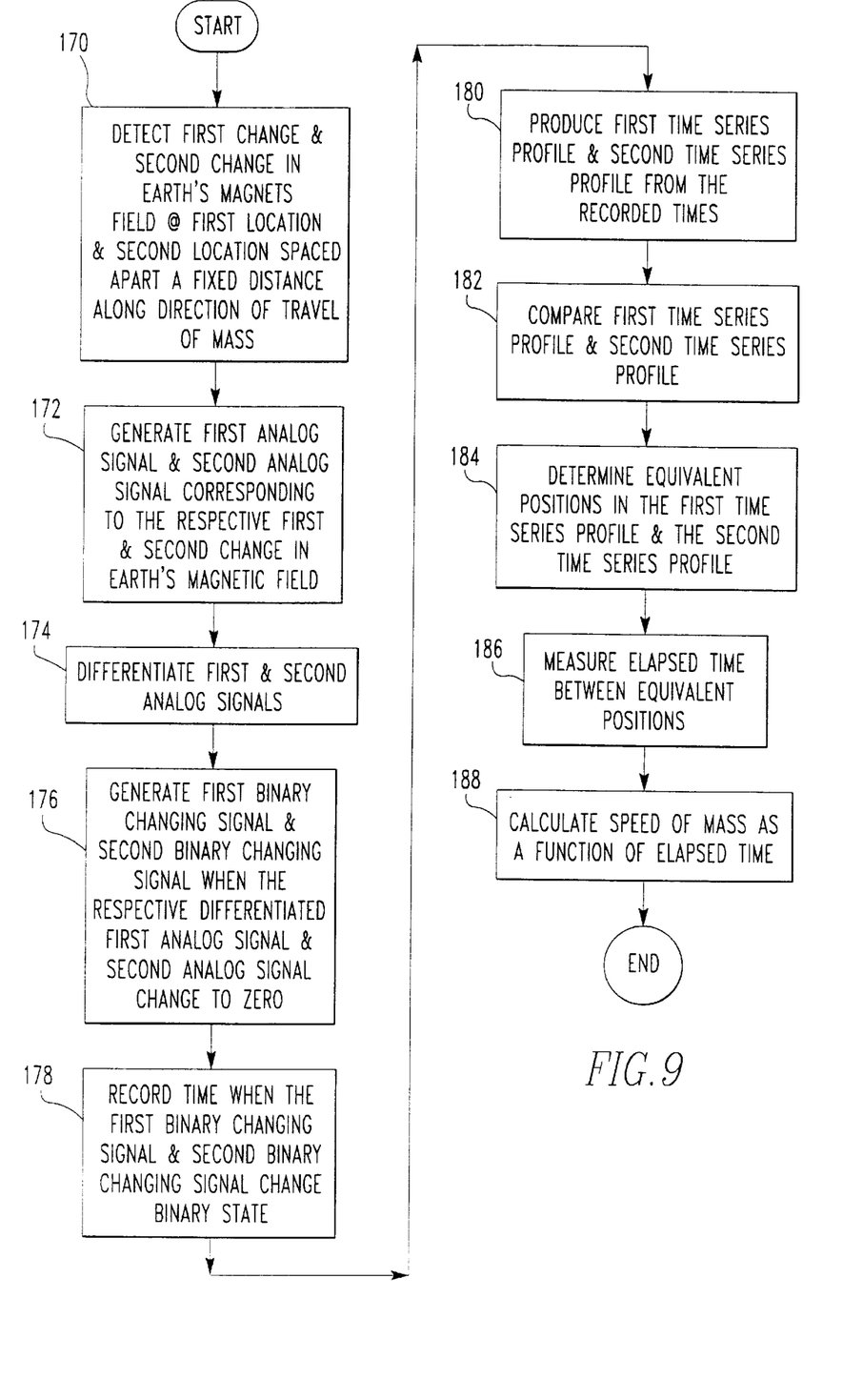
FIG. 9 is a diagrammatic illustration of a procedure for detecting the velocity of a magnetically permeable mass.

With reference to FIG. 9, a flow chart illustrating a method for determining a speed of a magnetically permeable mass is provided. In step 170 a first change and a second change in the earth's magnetic field are detected at a first location and a second location spaced apart a fixed distance along a direction of travel of the mass. At step 172, a first analog signal and a second analog signal are generated corresponding to the respective first change and second change in the earth's magnetic field. The first analog signal and the second analog signal are differentiated at step 174. At step 176, a first binary changing signal and a second binary changing signal are generated when the respective differentiated first analog signal and second analog signal change to zero. The times when the first binary changing signal and the second binary changing signal change binary state are recorded at step 178. At step 180 a first time series profile and a second time series profile are produced from the recorded times of the respective first binary changing signal and the second binary changing signal. The first time series profile and the second time series profile are compared at step 182 and equivalent positions in the first time series profile and the second time series profile are determined at step 184. At step 186, the elapsed time between the equivalent positions are measured and, at step 188, the speed of the mass is calculated as a function of the elapsed time.

Figure 10:
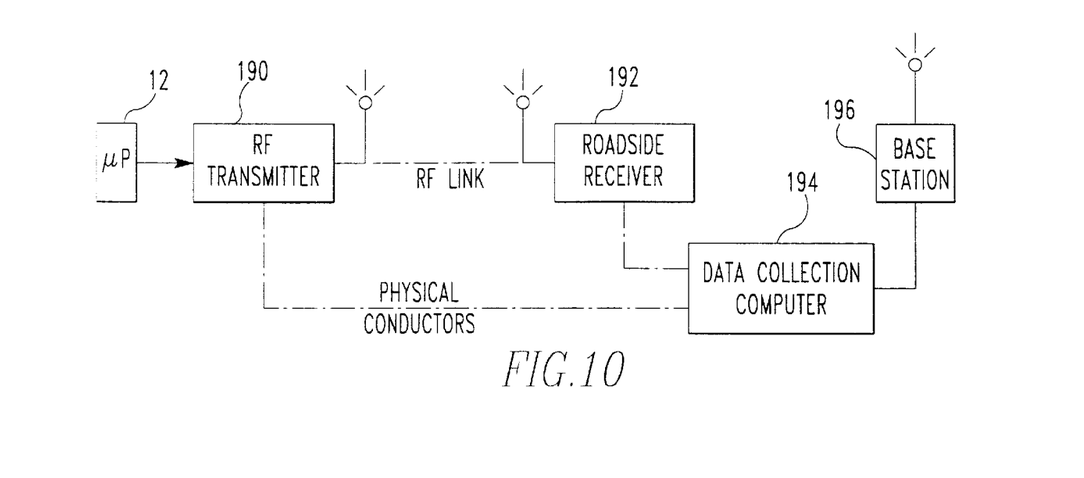
FIG. 10 is a block diagram of an RF communications network communicating information between the VMI sensor of FIG. 1 and a remote data collection computer.

With reference to FIG. 10 and with continuing reference to FIG. 1, in use, the above-described VMI sensor 2 is affixed to a road surface or is buried beneath the road surface. Because the VMI sensor 2 has limited memory 28, it is necessary to occasionally transfer the information stored therein to a data collection computer 194 for analysis. In one embodiment, the information stored in the VMI sensor 2 is transferred to the data collection computer 194 via physical conductors (shown in phantom in FIG. 10) connectable between the microprocessor 12 and the collecting computer 194. A problem with utilizing physical conductors, however, is the need to run the conductors between the VMI sensor 2 and the data collection computer 194. This is particularly a problem on busy roadways or in applications where the VMI sensor 2 is buried beneath the roadway. Another problem with utilizing physical conductors is the need for periodic visits to the installed VMI sensor 2 to collect the data. To overcome the above problems, and others, the VMI sensor 2 of the present invention includes a radio frequency (RF) transmitter 190 that is utilized to communicate data between the VMI sensor 2 and a roadside transceiver 192.

As shown in FIG. 1, the RF transmitter 190 is connected to receive data and command signals from the microprocessor 12. Because the VMI sensor 2 is battery powered, the output of the RF transceiver 190 is limited. Thus, it is necessary to have the roadside transceiver 192 located near, e.g., 30 meters, the VMI sensor 2 to receive the RF output from the RF transceiver 190.

Preferably, the roadside transceiver 192 is a fixed site transceiver positioned within the range of the RF transmitter 190 of the VMI sensor 2. The roadside transceiver 192 preferably includes a signal booster that enables communication from the VMI sensor 2 to a remote base station 196.

At a suitable time the VMI sensor 2 transfers data stored in memory 28 to the roadside transceiver 192 via the RF transmitter 190. The roadside transceiver 192 receives the data from the VMI sensor 2 and communicates the data to the base station 196. The data received by the base station 196 is routed to the data collection computer 194 for suitable processing. An advantage of this embodiment is that one fixed site roadside transceiver 192 can be utilized to communicate data from one or more RF transmitter 190 to the base station 196. Moreover, a network of RF transmitters 190 and roadside transceivers 192 can be utilized to provide to the base station 196 indications of vehicle movement at a plurality of different locations. This is particularly advantageous for evaluating traffic patterns over a wide geographical region.

Accordingly, the present invention provides a VMI sensor 2 and method for detecting vehicle characteristics and for detecting a speed of a vehicle.

The invention has been described in connection with the preferred embodiments. Obvious modifications and alterations will occur to others upon reading and understanding the preceding detailed description. For example, the magnetic detector 50 could be comprised of one magnetically variable resistor 52 connected to suitable electronic circuitry (not shown) which provides an output signal that corresponds to changes in the resistance of the one magnetically variable resistor in response to changing magnetic fields. The output of such a magnetic field sensor can be provided to the differentiator 88 and the zero slope detector 96 in the manner set forth above in connection with the embodiment of FIG. 2. In yet another embodiment, the differentiators 8, 14 can be omitted and the first ADC 10 and the second ADC 16 can be utilized to sample periodically, e.g., about every 250 microseconds, the output of the lead sensor 4 and the lag sensor 6 and generate therefrom the first time series profile and the second time series profile, respectively. Moreover, if sufficient bias can be applied, the magnetically variable resistors 52 can be connected directly to their corresponding ADC 10, 16 and/or differentiator 8, 14. It is intended that the invention be construed as including all such modifications and alterations insofar as they come within the scope of the appended claims or the equivalents thereof.

Having described the preferred embodiments the invention is now claimed to be:

1. A sensor for detecting a magnetically permeable mass by disturbance of the earth's magnetic field adjacent the sensor, the sensor comprising:

a magnetic field detector formed from one or more magnetically variable resistors;

a flux concentrator for concentrating magnetic flux towards the one or more magnetically variable resistors;

a biasing means for supplying an electrical bias to the one or more magnetically variable resistors;

an amplifier for sensing changes in the resistance of the one or more magnetically variable resistors and for producing an output indicative thereof;

a differentiator for differentiating the output of the amplifier;

a zero slope detector for detecting the output of the differentiator and for generating a binary changing signal when the output of the differentiator is zero;

a counter that accumulates values at a predetermined rate; and a processor for storing a value of the counter when the zero slope detector generates the binary changing signal, for converting into a first time series profile the stored counter values and for accumulating and storing a count of masses passing the sensor.

2. The sensor as set forth in claim 1, wherein the one or more magnetically variable resistors and the flux concentrator are enclosed in a package.

3. The sensor as set forth in claim 2, further including an external flux concentrator positioned on one end of the package.

4. The sensor as set forth in claim 3, wherein:

the external flux concentrator includes a neck that extends towards a central part of the package; and the neck terminates at a distal end adjacent the one or more magnetically variable resistors.

5. The sensor as set forth in claim 4, wherein the external flux concentrator has a permeability of about 35,000 at 40 gauss.

6. An apparatus for detecting the speed of a magnetically permeable mass by disturbance of the earth's magnetic field adjacent the apparatus, the apparatus comprising:

a) first and second magnetic field sensors each comprising:

a magnetic field detector formed from a magnetically variable resistor;

a first flux concentrator for concentrating magnetic flux towards the magnetically variable resistor;

a biasing means for supplying an electrical bias to the magnetically variable resistor;

an amplifier for sensing changes in the resistance of the magnetically variable resistor and for producing an output indicative thereof;

a differentiator for differentiating the output of the amplifier;

a zero slope detector for detecting the output of the differentiator and for generating a binary changing signal when the output of the differentiator is zero;

b) a counter that accumulates values at a predetermined rate; and c) a processor for storing a first series of values of the counter in response to the zero slope detector of the first magnetic field sensor generating binary changing signals, for storing a second series of values of the counter in response to the zero slope detector of the second magnetic field sensor generating binary changing signals, for converting the first series of values into a first time series profile, for converting the second series of values into a second time series profile, for measuring a difference in time between equivalent positions in the first time series profile and the second time series profile and for calculating the speed of the mass as a function of the difference.

7. The apparatus as set forth in claim 6, wherein:

the magnetically variable resistor is formed from a pair of magnetically variable resistors positioned end-to-end and forming a gap therebetween; and the first flux concentrator is positioned on opposite sides of the pair of end-to-end magnetically variable resistors.

8. The apparatus as set forth in claim 7, further including an external flux concentrator positionable adjacent the sides of the first flux concentrator opposite the pair of end-to-end magnetically variable resistors.

9. The apparatus as set forth in claim 8, wherein the external flux concentrator adjacent one side of the flux concentrator has a neck that extends towards the pair of end-to-end magnetically variable resistors and terminates at a distal end adjacent thereof.

10. The apparatus as set forth in claim 9, wherein the end-to-end magnetically variable resistors are positionable substantially perpendicular to a direction of travel of the mass.

11. The apparatus as set forth in claim 6, wherein the processor calculates from one of the first time series profile and second time series profile a time the mass is over the respective first magnetic field sensor and second magnetic field sensor and the length of the mass passing thereby.

12. The apparatus as set forth in claim 6, further including a compensating means for compensating a bias on the amplifier.

13. A method for counting vehicles passing a location, the method comprising the steps of:

detecting changes in resistance of a first magnetically variable resistor in response to a vehicle passing thereby;

generating a first analog signal corresponding to changes in the resistance of the first magnetically variable resistor;

differentiating the first analog signal;

producing a first binary changing signal that changes binary state when the slope of the differentiated first analog signal equals zero;

recording a first series of times when the first binary changing signal changes binary state;

producing from the recorded first series of times a first time series profile; and accumulating and storing a count of passing vehicles as a function of the first time series profile.

14. The method as set forth in claim 13, further including:

detecting changes in resistance of a second magnetically variable resistor in response to the vehicle passing thereby, the second magnetically variable resistor spaced apart from the first magnetically variable resistor;

generating a second analog signal corresponding to the changes in the resistance of the second magnetically variable resistor;

differentiating the second analog signal;

producing a second binary changing signal that changes binary state when the slope of the differentiated second analog signal equals zero;

recording a second series of times when the second binary changing signal changes binary state;

producing from the recorded second series of times a second time series profile; and accumulating and storing a count of passing vehicles as a function of the second time series profile.

15. The method as set forth in claim 13, further including the step of:

comparing the first time series profile to a reference time series profile;

determining from the comparison a characteristic of the vehicle passing the location.

16. The method as set forth in claim 15, wherein the stored count of passing vehicles is at least one of the sum of passing vehicles and the type of passing vehicles.

17. The method as set forth in claim 14, further including the step of:

determining spaced equivalent positions in the first time series profile and the second time series profile;

measuring an elapsed time between the spaced equivalent positions; and calculating the speed of the vehicle from the elapsed time.

18. An apparatus for counting vehicles passing a location, the apparatus comprising:

a first magnetically variable resistor positionable to detect changes in magnetic field at the location in response to vehicles passing thereby;

an amplifier means connected to the first magnetically variable resistor for generating a first analog signal corresponding to the changes in the resistance of the first magnetically variable resistor;

a converting means for converting the first analog signal into a first binary changing time series profile, with the first binary changing time series profile changing binary state when a slope of the first analog signal equals zero; and a storage means for accumulating and storing a count of passing vehicles.

19. The apparatus as set forth in claim 18, further including:

a) a second magnetically variable resistor positionable to detect changes in magnetic field at the location in response to vehicles passing thereby, the second magnetically variable resistor spaced from the first magnetically variable resistor, wherein:

the amplifier means is connected to the second magnetically variable resistor for generating a second analog signal corresponding to changes in the resistance of the second magnetically variable resistor; and the converting means converts the second analog signal into a second binary changing time series profile; with the second binary changing time series profile changing binary state when a slope of the second analog signal equals zero; and b) a measuring means for measuring elapsed time between spaced equivalent positions in the first binary changing time series profile and the second binary changing time series profile and for calculating the speed of the vehicle therefrom whereby the count is classified according to speed.

20. The apparatus as set forth in claim 18, wherein the count is classified according to one of a sum of passing vehicles and the types of passing vehicles.

* * * * *